(12) United States Patent
Hargrove et al.

(10) Patent No.: US 7,224,180 B2
(45) Date of Patent: May 29, 2007

(54) METHODS AND SYSTEMS FOR RISE-TIME IMPROVEMENTS IN DIFFERENTIAL SIGNAL OUTPUTS

(75) Inventors: Michael Hargrove, Clinton Corners, NY (US); David Meltzer, Wappinger Falls, NY (US)

(73) Assignee: Seiko Epson Corporation, Tokyo (JP)

( * ) Notice: Subject to any disclaimer, the term of this patent is extended or adjusted under 35 U.S.C. 154(b) by 91 days.

(21) Appl. No.: 10/991,724

(22) Filed: Nov. 18, 2004

(65) Prior Publication Data

US 2006/0103418 A1 May 18, 2006

(51) Int. Cl.
*H03K 17/16* (2006.01)
*H03H 7/38* (2006.01)
*H01P 5/12* (2006.01)

(52) U.S. Cl. ............ 326/30; 326/82; 326/26; 333/32; 333/33; 333/124

(58) Field of Classification Search ............ 326/30, 326/26, 82; 333/5, 12, 17.3, 32, 33, 124
See application file for complete search history.

(56) References Cited

U.S. PATENT DOCUMENTS

| | | | |
|---|---|---|---|
| 4,791,521 A | 12/1988 | Ouyang et al. | |
| 5,508,639 A | 4/1996 | Fattaruso | |
| 6,249,193 B1 | 6/2001 | Abadeer et al. | |
| 6,278,339 B2 | 8/2001 | Abadeer et al. | |
| 6,362,667 B2 | 3/2002 | Killat et al. | |
| 6,509,755 B2 | 1/2003 | Hernandez-Marti | |
| 6,522,083 B1 | 2/2003 | Roach | |
| 6,559,723 B2 | 5/2003 | Hollenbeck et al. | |
| 7,005,939 B2 * | 2/2006 | Zerbe et al. ............ | 333/100 |
| 2006/0017462 A1* | 1/2006 | Kao ............ | 326/62 |

OTHER PUBLICATIONS

"Bandwidth Extension in CMOS with Optimized On-Chip Inductors", by Sunderarajan S. Mohan, et al., IEEE Journal of Solid-State Circuits, vol. 35, No. 3, Mar. 2000, pp. 346-355.
"On the External Inductive Coupling of Differential Signalling on Printed Circuit Boards", by Marco Leone, et al., IEEE Transactions on Electromagnetic Compatibility, vol. 46, No. 1, Feb. 2004, pp. 54-61.
"A Slew-Rate Controlled Output Driver Using PLL as Compensation Circuit" by Soon-Kyun Shin, et al., IEEE Journal of Solid-State Circuits, vol. 38, No. 7, Jul. 2003, pp. 1227-1233.
"A Symmetric Minature 3D Inductor", by Srinivas Kodali, et al., Dept. of Electrical Engineering, Campus Box 352500, University of Washington, Seattle, WA 98195, 2003, pp. I-89-I-92, no month.
"Application Specific CMOS Output Driver Circuit Design Techniques to Reduce Simultaneous Switching Noise", by R. Senthinathan and J.L. Prince, IEEE Journal of Solid State Circuits, vol. 28, No. 12, Dec. 1993, pp. 1383-1388.

* cited by examiner

*Primary Examiner*—Daniel D. Chang

(57) ABSTRACT

A method for maintaining signal integrity of a differential output signal generated from a differential driver is disclosed. The method includes receiving the differential output signal from the differential driver. Once received, the method includes tuning the differential output signal by exposing the differential output signal to an inductance. The inductance is configured to reduce signal mismatch between complementary signals of the differential output signal. The signal mismatch is a result of having each of the complementary signals exposed to different capacitive loading. A device and system is also provided, which include integrating an inductor between the output leads of a differential driver. The inductor is sized for the particular frequency of operation, and the inductor provides an inductance that assists in eliminating mismatch between the complementary signals of the differential output. A reduction and/or elimination of the mismatch will assist in improving the rise-time of the differential signals.

23 Claims, 7 Drawing Sheets

METHODS AND SYSTEMS FOR RISE-TIME IMPROVEMENTS IN DIFFERENTIAL SIGNAL OUTPUTS

BACKGROUND OF THE INVENTION

1. Field of the Invention

This invention relates generally to methods and structures for improving signal transmission in electronic circuits, and more particularly to methods and structures that enable improvements in rise-time performance for differential output signals.

2. Description of the Related Art

In the design and fabrication of electronic circuits, it is well known that capacitive loading, particularly impedance from parasitic capacitance from electrostatic discharge (ESD) protection circuitry, degrades the signal that is being transmitted on conductive traces or leads. As signals are transmitted on conductive leads separated by dielectric materials in a circuit (for example, a circuit fabricated on a multi-layered semiconductor chip), the signals are impeded by parasitic capacitance from the conductive leads. Also, electronic circuits may be subjected to ESD events by simple human handling. As is well known, ESD protection circuitry is designed to direct charge (i.e., current) from an ESD event away from more sensitive circuit elements to a power rail. However, as with any electronic component, ESD protection circuitry has some amount of intrinsic capacitance, which can impede signal transmission.

For signal transmission, it is particularly important, especially at higher frequencies (e.g., >1 GHz), to maintain good signal integrity. Although capacitive loading is a problem in single-ended data transmission, the problem can be exacerbated when driving differential signals. This is particularly true when a mismatch in capacitive loading is present at a pair of complementary output leads. In this situation, the differential output signal can be significantly degraded since each output leas may be subjected to a different amount of capacitive loading, which causes the output lead to have different slew rates and thus introduce mismatch into the switching behavior of the differential signal. However, even if the capacitive loading is matched, the presence of excessive capacitive loading can still substantially degrade differential signal transmission by slowing down its switching behavior, i.e. increases its low to high slew rate and its high to low slew rate.

As well known in the art, any circuit component has some amount of intrinsic, parasitic, capacitance. Therefore, minimizing capacitive loading along a signal path can be difficult since the signal path itself is a source of capacitive loading. Typically, reducing the size of components that are coupled to a signal path minimizes intrinsic capacitive loads. However, the size of certain circuit components cannot be reduced. For example, ESD protection circuits, which must withstand high voltages, and quickly discharge large current spikes, are generally large and must be attached to input and output pads to protect the integrated circuit (IC). Furthermore, although advances in IC manufacturing has led to reduction of device sizes, the size of ESD circuitry has not followed the same reduction because the amount of charge ESD circuitry must withstand has not seen a reduction. Thus, the size of ESD circuitry has remained relatively unchanged, while other circuit components have been reduced. As a result, ESD protection circuitry will generally add a substantial amount of intrinsic capacitive loading at an output, such as an output signal driver. As an example, at high operating frequencies, such as of 1.25 GHz, ESD protection circuitry should not present capacitive loading greater than 0.8 pF, otherwise the signal from an output driver may be degraded.

In order to minimize this potential problem in high frequency devices, circuit designers have typically designed impedance matching devices to null-out load impedance presented by ESD circuitry, pad capacitance, etc., and ultimately, provide matched output load impedance. Matched load impedance provides an environment where signal integrity can be maintained.

FIG. 1 illustrates a typical impedance matching technique 100 that provides independent and separate impedance matching networks 110a and 110b respectively on output leads 108a and 108b of a differential driver 106. As illustrated in FIG. 1, the differential driver 106 receives complementary signals Din and Din_c on leads 104a and 104b from core circuitry 102. The differential driver 106 produces complementary signals Din' and Din_c' on output leads 108a and 108b. To protect the differential driver 106 and core circuitry 102 from ESD events, separate ESD protection circuitry, represented by their effective capacitive loads 112a and 112b, are respectively connected to the first and second output leads 108a and 108b. Each component of the differential output signal carried on the differential output leads 108a and 108b is independently and separately matched to compensate for capacitive loading from parasitic capacitance and each of the effective capacitive loads 112a and 112b. Unfortunately, implementing the impedance matching networks 110a and 110b on-chip requires significant silicon area for their integration. Another drawback of implementing impedance matching networks 110a and 110b is the potential for mismatch between matching networks due to process variations in the IC fabrication process. Consequently, because each impedance matching network 110a and 110b is independently matched, mismatch will still happen between the signals output from the output leads 108a and 108b.

U.S. Pat. Nos. 6,278,339 and 6,249,193 are directed to methods of impedance matching in single-ended drivers by incorporating an adjustable-length transmission line. The transmission line is adjusted in proportion to the magnitude of transients on the driver circuit output. Parallel conductive lines are formed on a printed circuit board, PCB, and shorted by a movable stub from the transmission line.

Another technique for single-ended driver output matching is set forth in U.S. Pat. No. 6,509,755. This patent disclosed a method of detecting an output current from the driver to the load, and scaling the detected current. The scaled current is then subtracted from the input voltage level, thereby providing a dynamic impedance matching technique.

Also, U.S. Pat. No. 6,522,083 proposed a method of tuning the driver output by using an isolation circuit and matching network coupled to the output driver.

These patents provide ways for individual impedance matching in single ended driver outputs and thus fail to address the potential for mismatch between each of the outputs of a pair of differential outputs. Thus, there is a need for methods and structures that provide improved matching for output signals, and particularly those signals that are driven off chip.

OBJECTS OF THE INVENTION

One object of the present invention is to provide a structure and method for reducing impedance load effects.

Another object of the present invention is to provide a structure that can be incorporated in an IC.

A further object of the present invention is to provide a structure that can easily be modified to counteract the impedance load effects of various load structures having differently sized parasitic capacitances.

Yet another object of the present invention is to provide a structure and method that provides better matching of the upward and downward slew rates of the complementary outputs of a differential output signal, such that signal integrity can be maintained.

SUMMARY OF THE INVENTION

The present invention provides the methods and structures that enable improvements in rise-time performance and reduce signal mismatch in differential output signals. As used herein, "signal mismatch" in differential signals is a condition that occurs when simultaneously outputted signals of a differential signal pair, which are 180 degrees output of phase relative to each other, have different rise and fall times, i.e. slew rates, such that the upward swinging output signal reaches a logic high voltage level much before or much after the downward swinging output signal reaches a logic low voltage level. Thus, even though a differential signal output pair has one output signal going high and one output signal going low, a mismatch happens when the signal going low is not lined up (e.g., is offset, slower, faster, etc), with the signal going high of the same differential signal output pair. Several inventive embodiments of the present invention are described below.

In one embodiment, a method for maintaining signal integrity of a differential output signal generated from a differential driver is disclosed. The method initially includes receiving the differential output signal from the differential driver. Then, tuning the differential output signal by exposing the differential output signal to an inductance. The inductance is configured to reduce signal mismatch between complementary signals of the differential output signal, where the signal mismatch is a result of having the complementary signals exposed to different capacitive loading.

In another embodiment, a tuning circuit for improving rise-time of a differential output signal is provided. The tuning circuit includes a differential driver for receiving a differential input and generating a differential output signal onto a first differential output lead and a second differential output lead. Further included is an inductor coupled between the first differential output lead and the second differential output lead of the differential driver. First electrostatic discharge (ESD) capacitive circuitry is coupled to a first output terminal. The first output terminal is coupled to the inductor, and second ESD capacitive circuitry is coupled to a second output terminal, where the second output terminal is coupled to the_inductor. The inductor is positioned between the differential driver and the first output terminal and the second output terminal. In this embodiment, the inductor produces an inductance between the first differential output lead and the second differential output lead, and the inductance acts to reduce signal mismatch in complementary signals of the differential output signal that is to be presented to the first and second output terminals.

In yet another embodiment, a tuning device for improving rise-time of a differential output signal generated in a semiconductor chip is provided. The tuning device includes core circuitry and a differential driver. The differential driver interfaces with the core circuitry and is capable of receiving a differential input from the core circuitry. The differential driver is configured to produce a differential output signal onto a first differential output lead and a second differential output lead. Further included is an inductor that is coupled between the first differential output lead and the second differential output lead of the differential driver. Also part of the tuning device is first electrostatic discharge (ESD) circuitry that is coupled to the first differential output lead which connects to a first pad and the inductor. Second ESD circuitry is coupled to the second differential output lead that connects to a second pad and the inductor. The inductor is capable of producing an inductance between the first differential output lead and the second differential output lead, and the inductance acts to reduce signal mismatch in complementary signals of the differential output signal that is to be presented to the first pad and the second pad.

In still another embodiment, a tuning system for improving rise-time of a differential output signal generated in a semiconductor chip is disclosed. The system includes core circuitry and a differential driver. The differential driver interfaces with the core circuitry and is capable of receiving a differential input from the core circuitry. The differential driver is configured to produce a differential output signal onto a first differential output lead and a second differential output lead. The system further includes first electrostatic discharge (ESD) circuitry that is coupled to the first differential output lead that connects to a first pad, and a second ESD capacitive structure that is coupled to the second differential output lead that connects to a second pad. The system also includes an off-chip inductor. The off-chip inductor is interconnected to the first pad and the second pad, and the off-chip inductor produces an inductance between the first pad and the second pad, where the inductance acts to reduce signal mismatch in complementary signals of the differential output signal that is to be presented to the first pad and the second pad.

In another embodiment, an integrated circuit is provided. The integrated circuit is capable of outputting a differential output signal. The integrated circuit includes a differential driver for receiving a differential input and generating a differential output signal onto a first differential output lead and a second differential output lead. The integrated circuit also includes an inductor that is coupled between the first differential output lead and the second differential output lead of the differential driver. Further included is first electrostatic discharge (ESD) capacitive circuitry that is coupled to a first output terminal, and the first output terminal is coupled to the inductor. Second ESD capacitive circuitry is coupled to a second output terminal, and the second output terminal is coupled to the_inductor. The inductor is positioned between the differential driver and the first output terminal and the second output terminal. The inductor produces an inductance between the first differential output lead and the second differential output lead, wherein the inductance acts to reduce signal mismatch in complementary signals of the differential output signal that is to be presented to the first and second output terminals.

In one embodiment, a system for maintaining signal integrity of a differential output signal generated by a differential driver is disclosed. The system includes means for receiving the differential output signal from the differential driver. The system also includes means for tuning the differential output signal by exposing the differential output signal to an inductance. The inductance is configured to reduce signal mismatch between complementary signals of the differential output signal, where the signal mismatch is a result of having the complementary signals exposed to different capacitive loading.

Other aspects and advantages of the invention will become apparent from the following detailed description, taken in conjunction with accompanying drawings, illustrating by way of examples the principles of the invention.

BRIEF DESCRIPTION OF THE DRAWINGS

The present invention will be readily understood by the following detailed description in conjunction with the accompanying drawings, where like reference numerals designate like structural elements.

DETAILED DESCRIPTION

The present invention, as illustrated by the following embodiments, provides the methods and structures that enable improvements in rise-time performance for single ended outputs, and improvements in rise and fall times for differential output signals. In particular, differential output signals that need to be driven off-chip will benefit from the improvements in rise and fall time performance. As should be appreciated, the present invention can be implemented in various ways, including a method, system, or device. In some instances, well known process operations have not been described in detail in order to avoid obscuring the present invention.

Figure 1:
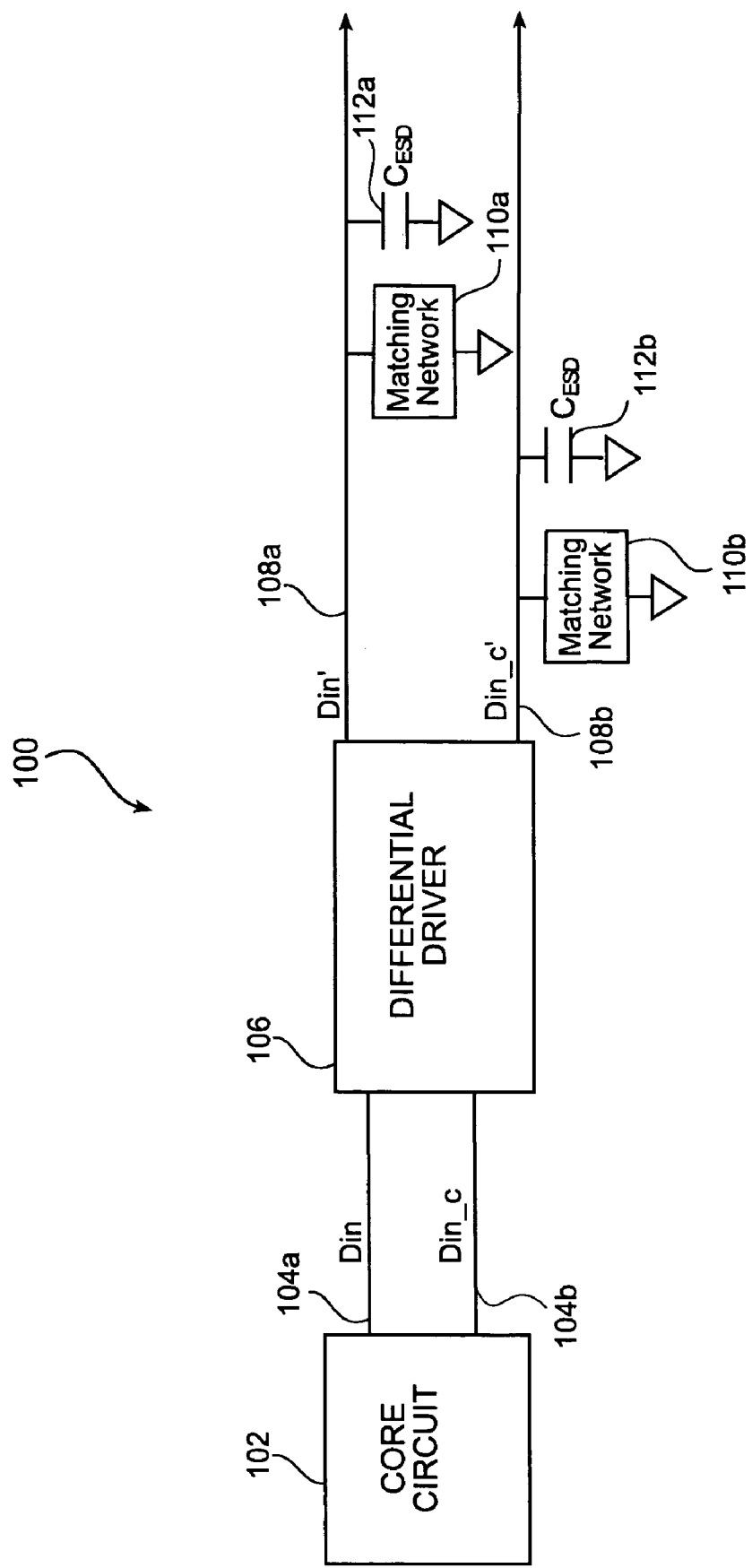
FIG. 1 is a schematic diagram showing a typical load impedance technique where independent and separate impedance matching networks are used.
Figure 2A:
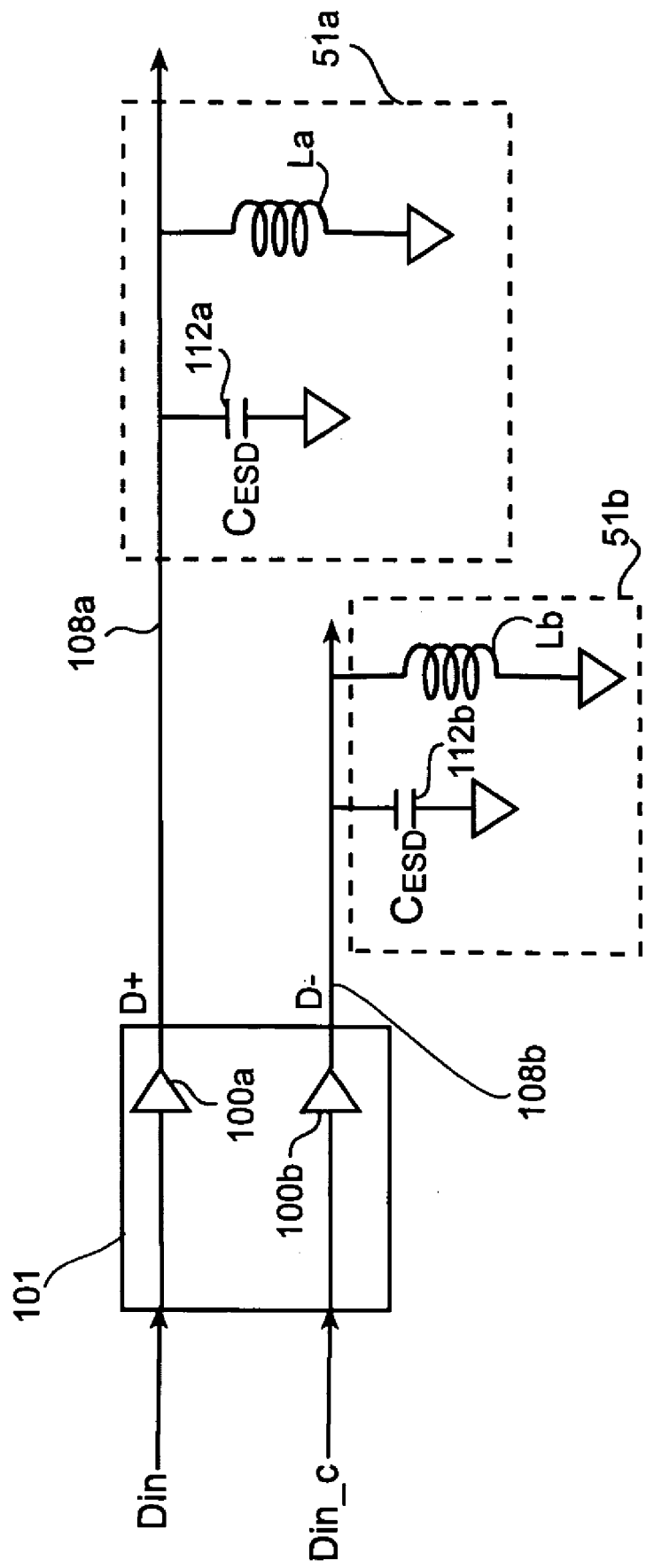
FIG. 2A is a block diagram of a first embodiment of the present invention as applied to a single-ended output driver.

With reference to FIG. 2A, a differential driver 101 is typically comprised of two single-ended drivers 100*a* and 100*b*, each having separate outputs D+ and D− for driving respective output leads 108*a* and 108*b*. Each driver 100*a* and 100*b* drives the complementary signal of the other. That is, while driver 100*a* outputs a true signal on output D+, driver 100*b* drives the complement signal on output D−, and vise-versa. For the sake of simplicity, the following discussion regarding FIG. 2A describes the present invention as individually, and separately, applied to each single-ended driver 100*a* and 100*b*. Later, a description of the present invention simultaneously applied to both outputs D+ and D− of differential driver 101 is given. It is to be understood that much of the invention description given here as individually applied to a single-ended driver, 100*a* or 100*b*, may be applied to the present invention simultaneously applied to both outputs D+ and D− of a differential output driver 101.

Each output D+ and D− of a differential output driver 101 typically includes electrostatic discharge (ESD) protection circuitry to clamp to VCC any upward voltage surges and clamp to ground any downward voltage surges. Minimally, an ESD circuit may consist of a single clamping diode between an output lead and a power rail, VCC or ground. However, various types of ESD circuitry are known, and for the sake of brevity, only the parasitic capacitance CESD intrinsic to all ESD circuitry is shown.

Irrespective of their specific circuit configuration, all ESD circuits need to react quickly, withstand very high voltages, and sink large currents. Therefore, ESD circuitry is typically large, and thus adds a significant amount of parasitic capacitance CESD to an output driver 100*a* or 100*b*. The relative large size of the ESD circuitry is especially pronounced when compared with the miniaturized circuitry of the internal core of an IC, which the ESD circuits protect. This disparity in size is exacerbated as advances in IC manufacturing further reduce the minimum device size of the core circuitry since the size of ESD circuits cannot be reduced along with the core circuitry due to the magnitudes of electrostatic discharge an IC must withstand (i.e. static electricity from a handler) remaining unchanged. Therefore, the relative size of ESD circuitry, and thereby the relative size of its intrinsic parasitic capacitance (as compared to the core circuitry) increases as the minimum device size of the core circuitry is reduced. This poses a growing problem since a smaller device has a reduced capacity for driving current, and it therefore requires more time to charge the ESD circuit's parasitic capacitance in order to bring an output signal high and requires more time to discharges the ESD's circuit's parasitic capacitance in order to bring an output signal low. Consequently, more time is traditionally required to drive outputs having ESD protection circuitry, or other circuits having large intrinsic capacitances. This limitation in speed performance is exacerbated at high frequency requirements since the necessity for ESD circuitry can significantly limit the output driver's maximum operating frequency.

As it is known, the larger a capacitive load, the more time it takes to raise or lower a voltage potential across it. This time period may be reduced by increasing the amount of driving current, but this requires increasing the size each output driver 100*a* and 100*b*, and thus increasing the cost of an IC. Additional problems arise in differential output driver circuitry 101 since they require that their two outputs D+ and D− have exact opposite swings, but mismatch in the amount of load capacitance 112*a* and 112*b* at each differential output lead 108*a* and 108*b* can result in a different time constant for each, and thereby result in different voltage swings. As result, each of the two outputs D+ and D− of a differential output driver 101 may have a different time constant resulting in a mismatch in their opposite voltage swings (i.e. each of the two outputs would have a different rise and fall times).

Since the above-described problems are more pronounced at higher frequencies, the present invention seeks to reduce the capacitive loading effects of circuits (such as ESD circuitry) at the output of a signal driver.

An output driver in accord with the present invention adds a compensating inductance in parallel with the parasitic capacitance $C_{ESD}$ of the EDS circuit at each output D+ and D1. For example, inductance La is placed in parallel with parasitic capacitance 112a and inductance Lb is placed in parallel with parasitic capacitance 112b. This creates an effective bandpass frequency filter 51a and 51b at each output D+ and D− of each driver 100a and 100b. When designing an output driver for a high frequency application, one typically knows the frequency range at which the output driver is expected to operate. Since the desired operating frequency of each output driver 100a and 100b is known, the inductive values of La and Lb can be selected such that when each is combined with its corresponding parasitic capacitance 112a and 112b, the parallel combination creates a bandpass filter (51a and 51b) having resonance at the desired operation frequency. Thus, when individually applied to a single-ended driver, the operation of the present invention is dependent on frequency. Therefore, the when applied to a single-ended output driver, the present invention may be particularly suited for use with circuits having sustained operation at a particular frequency, such as the output of a clock generator, or oscillator.

Although the use of an inductor to nullify the loading effects of parasitic capacitance CESD addresses the problem of improving the maximum operating frequency of an output driver, applying a separate inductance La and Lb to each output lead 108a and 108b of a differential output driver does not address the issue of signal mismatch. That is, inductances La and Lb, which may be implemented using discrete or integrated inductors, may themselves not be perfectly matched and may themselves add some amount of mismatched intrinsic capacitance. This problem is solved in the structure of FIG. 2b, where inductors La and Lb are replaced with one cross-coupled inductor 210. This eliminates any additional mismatch due to using different inductors La and Lb, and since the two outputs of the differential output drivers have opposite voltage swings, the configuration is suitable for general differential signal drivers and is not limited to clock applications.

Figure 2B:
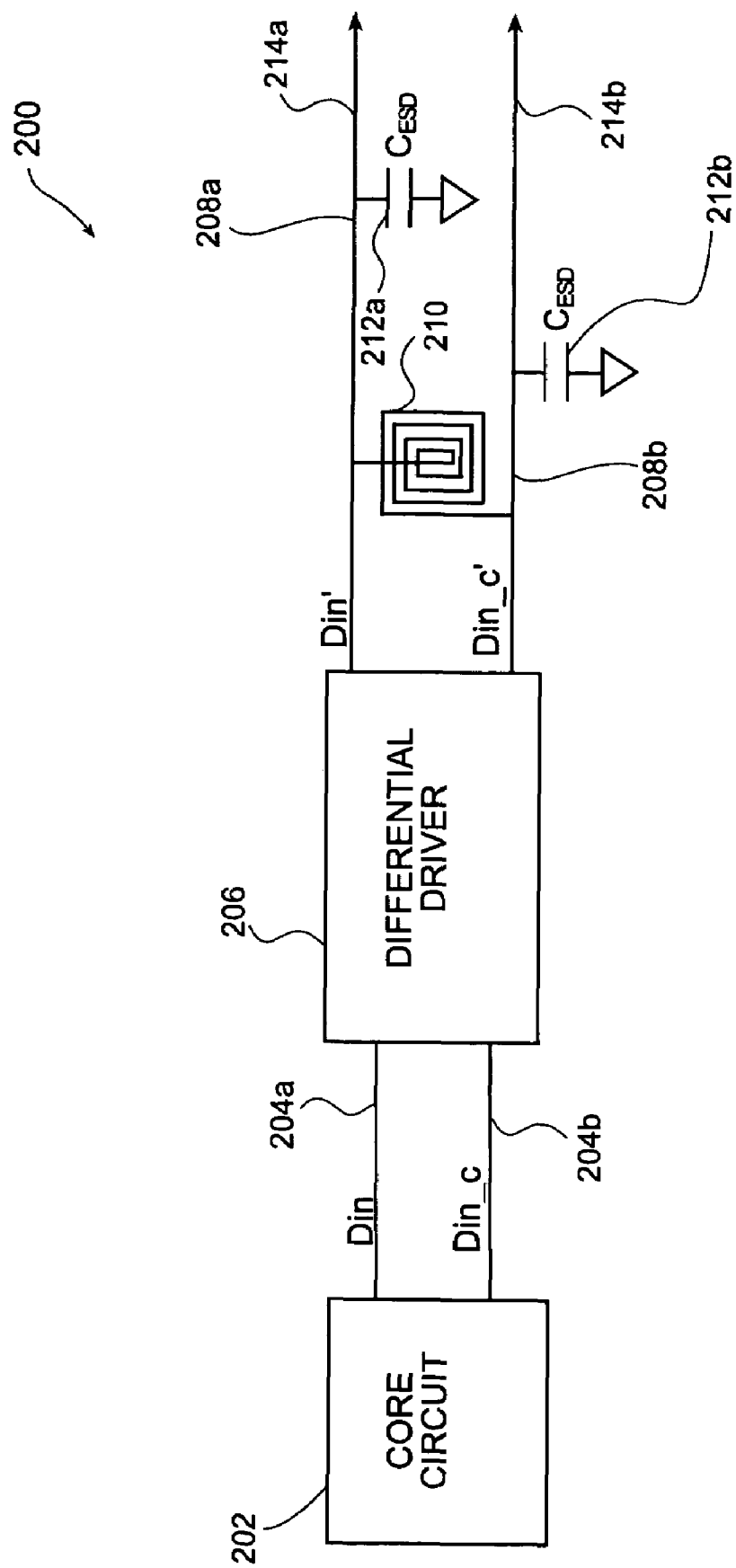
FIG. 2B is a schematic diagram of a cross-coupled signal matching technique where a cross-coupled inductor is used to tune a differential output signal, in accordance with a second embodiment of the present invention.

FIG. 2B illustrates a cross-coupled signal matching technique 200 in accordance with one embodiment of the present invention. Differential driver 206 receives a differential signal from a first differential input lead 204a and a second differential input lead 204b produced by core circuitry 202. In turn, the differential driver 206 produces a differential output signal on a first differential output lead 208a and a second differential output lead 208b. The differential driver 206 and the core circuitry 202 are protected from electrostatic discharge, ESD, events by first ESC protection circuitry represented by effective capacitive load 212a and second ESD protection circuitry represented by effective capacitive load 212b. Hereinafter, ESC protection circuitry will be represented by its respective effective capacitive load. The effective capacitive loads 212a and 212b are respectively connected to the first and second differential output leads 208a and 208b, and a first output terminal 214a and a second output terminal 214b. A cross-coupled inductor 210 is coupled between the first and second differential output leads 208a and 208b. The cross-coupled inductor 210 provides inductance to simultaneously tune both output signals of the differential output driver on first and second differential output leads 208a and 208b. Each differential output signal, when produced, will be exposed to the inductance. Consequently, signal mismatch between the two signals of the differential output resulting from capacitive loading is reduced or substantially eliminated. That is, the highs and lows of the complimentary signals of the differential driver are aligned and matched, such that signal integrity is maintained.

Still referring to FIG. 2B, in one particular embodiment, the cross-coupled inductor 210 is positioned between the differential driver 206 and the effective capacitive loads 212a and 212b of the ESD circuitry. The cross-coupled inductor 210 should be sized so as to provide resonant tuning of the ESD load capacitance at a specific maximum frequency of operation with cross-coupled inductor structure connected between the differential output terminals. In yet another embodiment, the cross-coupled inductor 210 can be a configurable inductor, using switch transistors to tap various points of an inductor (or multiple inductors) to adjust the cross-coupled inductance and produce the desired output performance (e.g., waveform) for the two differential output signals on first and second differential output leads 208a and 208b.

Parasitic capacitance may be determined based on the surface area and material properties of the respective differential output leads 208a and 208b. Intrinsic parasitic capacitance may also be determined based on the size and inherent properties of the components and isolative layers (e.g., the ESD protection circuitry) that are implemented. In some implementations, parasitic capacitance of the leads and attached components may be measured separately, and in other implementations, their combined parasitic capacitance may be measured as an effective total capacitance. Still further, depending on the target operational frequency, a specifically sized inductor can be integrated into the design. In this manner, the inductance will be appropriately proportioned to handle the anticipated impedance under the pre-set frequency of operation.

For illustration purposes, the differential output signal can be operated at a frequency of about 1.25 GHz, and the cross-coupled inductor 210 can be sized to produce an inductance between about 10 nH and about 25 nH. This range of inductance can thus tune the differential output signal, and thus reduce or substantially eliminate the mismatch produced by parasitic capacitance introduced by the ESD protection circuitry represented by its respective effective capacitive loads 212a and 212b. Of course, from chip-to-chip the frequency will be different and the sizing of the inductor 210 will be made according to the chip frequency and anticipated mismatch produced by the imbalance resulting from parasitic capacitive loading.

Figure 3A:
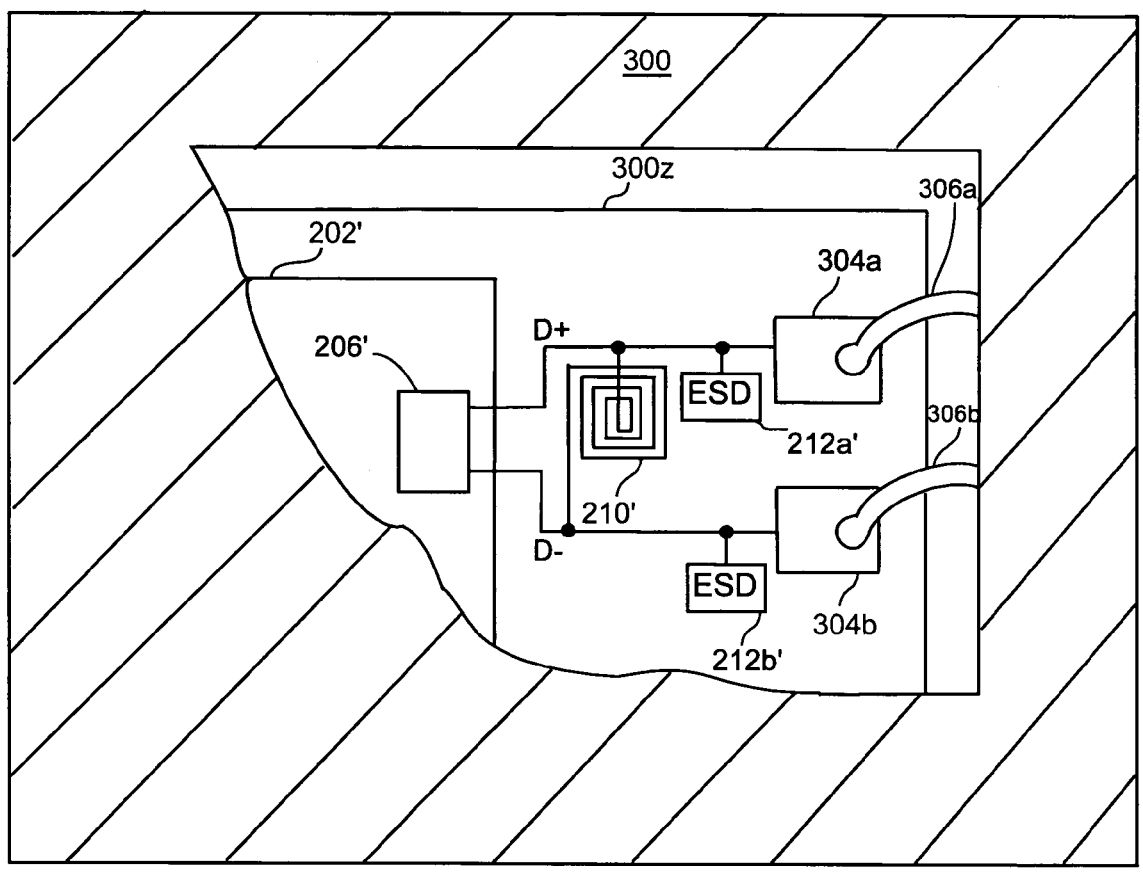
FIG. 3A is a diagram of a partially exposed semiconductor chip showing where an inductor is used to reduce or substantially eliminate mismatch of a differential output signal, in accordance with one embodiment of the present invention.

FIG. 3A illustrates a partially exposed semiconductor chip 300. The partially exposed semiconductor chip 300 illustrates a die 300z having core circuitry 202', a differential driver 206', a cross-coupled inductor 210', effective capacitive loads due to ESD circuits 212a' and 212b', and a first pad 304a and a second pad 304b. First and second bond wires 306a and 306b are respectively coupled to the first and second pads 304a and 304b and to output pins (not shown) of the semiconductor chip 300. In one embodiment of the present invention, the inductor 210' is implemented at a periphery of the semiconductor chip 300, which is the approximate location at which signals are driven off-chip. In another embodiment, first and second pads 304a and 304b are input/output pads capable of receiving input signals as well as transmitting output signals.

Still referring to FIG. 3A, in one embodiment, inductor 210' is a cross-coupled inductor. Inductor 210' may be fabricated as a multi-leveled structure in the semiconductor chip 300 (such as a multi-chip package structure) or on die 300z. Or, the inductor 210' can be fabricated substantially on one layer, and conductive vias and metal traces can complete the interconnections or cross-coupling, depending on the design of the inductor.

Figure 3B:
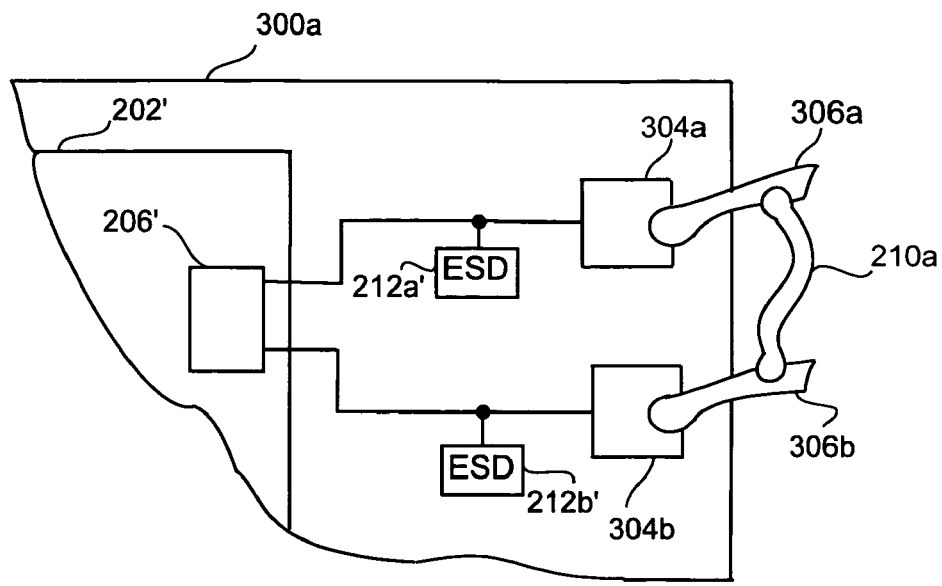
FIG. 3B is a diagram a partial view of a semiconductor chip showing an alternative method of implementing inductance to reduce or substantially eliminate mismatch of a differential output signal, in accordance with an embodiment of the present invention.

FIG. 3B illustrates an implementation wherein inductance is provided by a thin wire, in accordance with one embodiment of the present invention. As well known in the art, wires have an inherent amount of inductance. A wire of appropriate size with a desired inductance is selected for semiconductor 300A, and is coupled to bond wires 306a and 306b to provide an appropriate amount of inductance to reduce or substantially eliminate the mismatch of the differential signal due to parasitic capacitive loading. This embodiment may be particularly useful for maintaining signal integrity at higher frequencies. Such higher frequencies may be in the range of about 5 Gigahertz or higher.

Figure 3C:
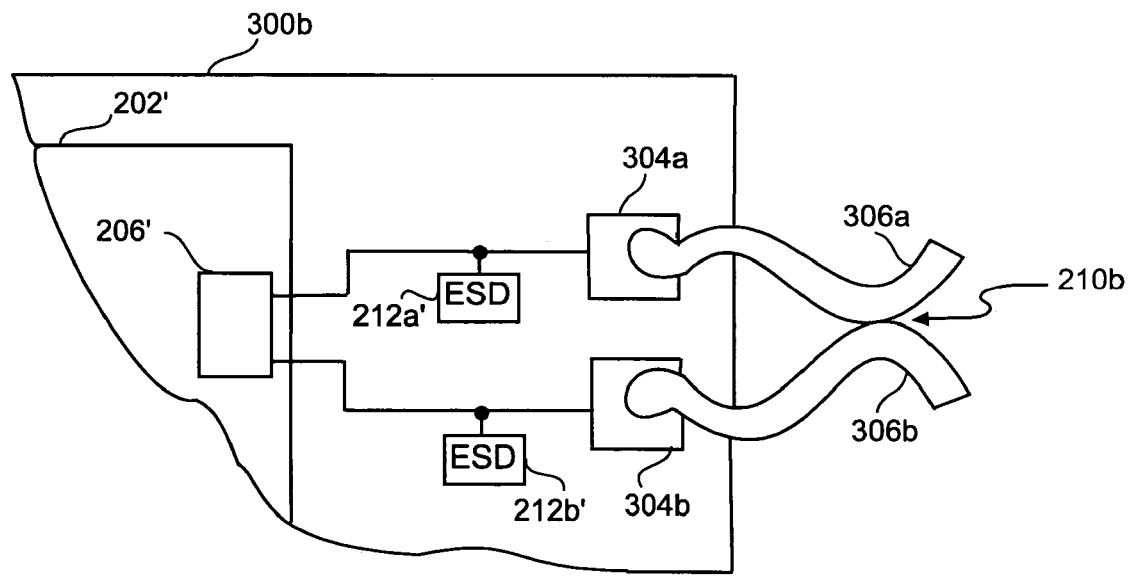
FIG. 3C is a diagram of a partial view of a semiconductor chip showing another method of implementing inductance to reduce or substantially eliminate mismatch of a differential output signal, in accordance with an embodiment of the present invention.

FIG. 3C shows semiconductor 300B, in accordance with another embodiment of the present invention. Bond wires 306a and 306b have an inherent amount of inductance, and by coupling bond wires 306a and 306b at a selected contact point 210b at a predetermined distance from bond pads 304a and 304b, a desirable amount of inductance can be configured to reduce or substantially eliminate the mismatch in the differential signal to maintain signal integrity. This embodiment may be useful at higher frequencies. Such higher frequencies may be in the range of about 5 Gigahertz or higher.

Figure 3D:
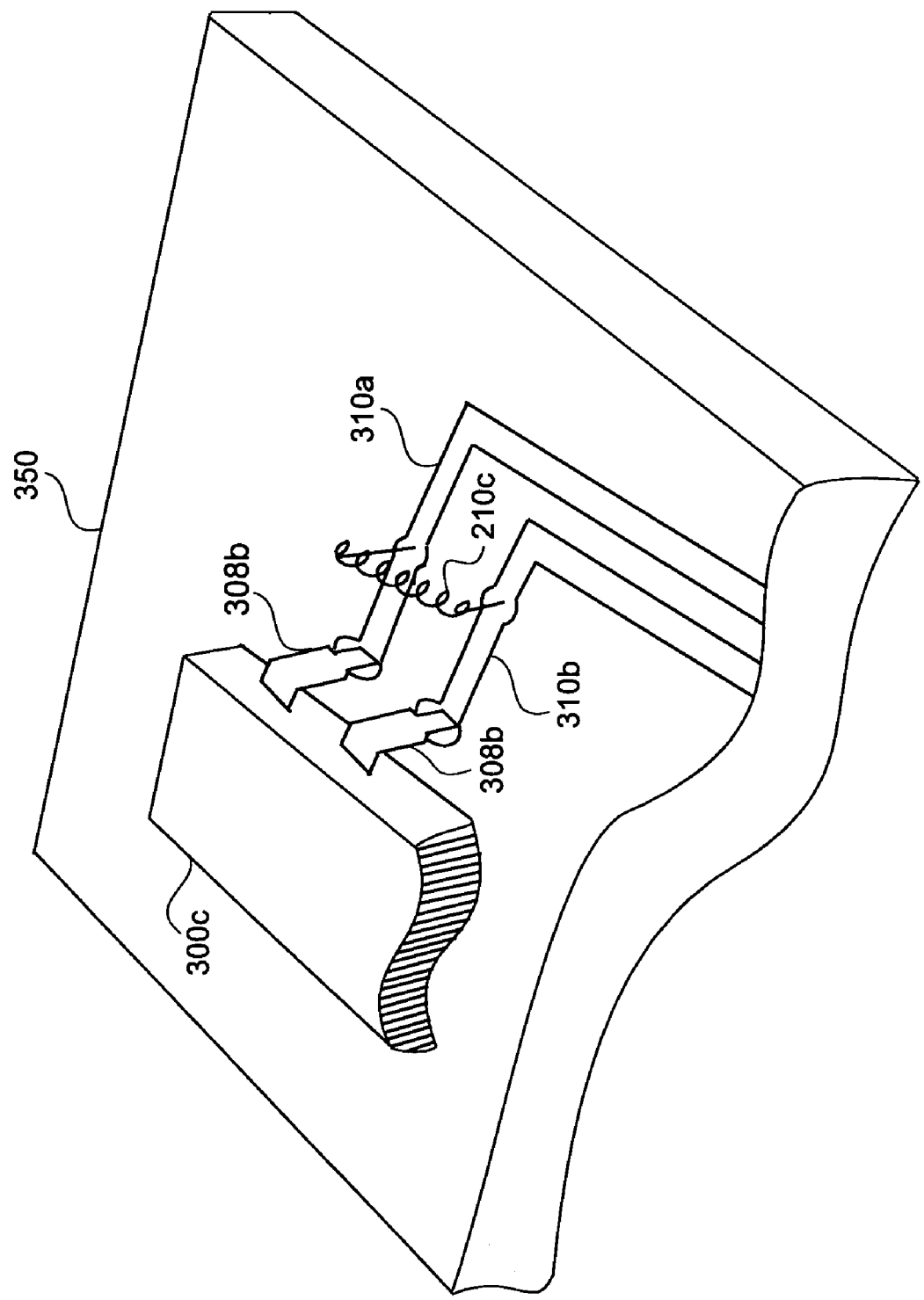
FIG. 3D is a diagram a semiconductor chip on a printed circuit board showing a discrete off-chip inductor being used to reduce or substantially eliminate mismatch of a differential output signal in accordance with an embodiment of the present invention.

FIG. 3D illustrates yet another embodiment where inductance may be provided by a discrete inductor 210c implemented outside of the semiconductor chip 300C. Discrete inductor 210c is connected to conductive leads 310a and 310b on printed circuit board 350. Output pins 308a and 308b from semiconductor chip 300C are connected to the conductive leads 310a and 310b. Discrete inductor 210c is appropriately sized so as to provide the proper amount of inductance to reduce or substantially eliminate the mismatch of the differential signal being output by the semiconductor 300C. The use of a discrete component on the printed circuit board 350 may be more suited for embodiments that operate at lower frequencies. Such lower frequencies may be those that are lower than about 1 Gigahertz.

Figure 4:
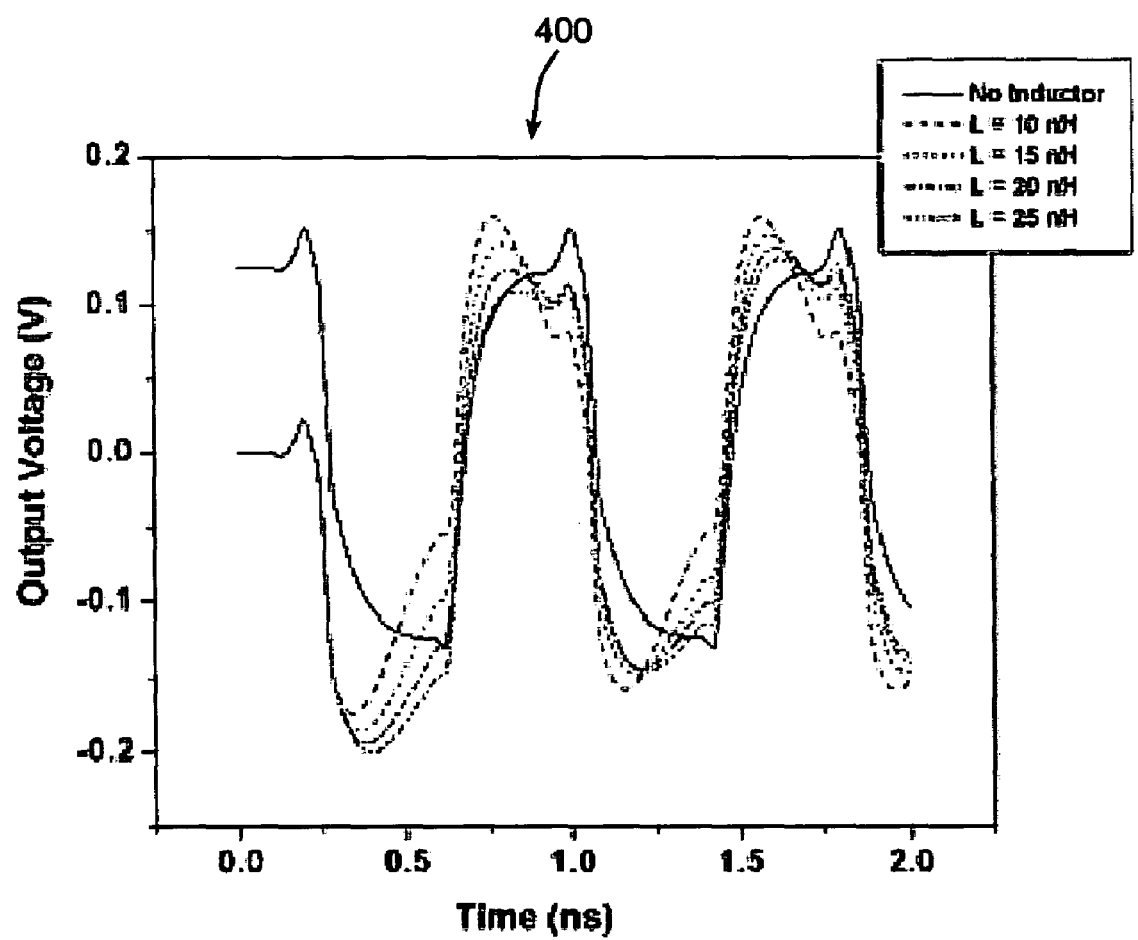
FIG. 4 is a graph of signal pulses illustrating the improvements in rise-times of one output lead of a differential output driver signal as the applied inductance is varied, in accordance with an embodiment of the present invention.

FIG. 4 shows exemplary signal pulses of different rise times dependent on different inductance values used for the inductor 210 (see FIG. 2A), in accordance with one embodiment of the present invention. The graph shows plots of rise-times for a differential output signal at a load impedance of 2 pF coupled in parallel with a 100Ω resistance, as various inductances are applied to the differential output signal. A solid curve, as shown on the rise-time graph 400, is a plot of rise-time for a differential pulse signal operated at 1.25 GHz. The solid curve is the reference result without providing an inductance in accordance with the embodiments of the invention. The other curves shown on the rise-time graph 400 are plots of rise-times for the differential output signal with various inductances ranging from about 10 nH to about 25 nH applied to the differential signal to tune out the signal mismatch.

As can be seen on FIG. 4, the rise-time of the differential signal is improved as inductance is applied to the output signal lead. However, it should be understood that the inductances, as illustrated in FIG. 4, are only example values, and these values will change depending on the circuit arrangement and the frequency of operation. Consequently, the structural implementation of the inductor 210, which is coupled between the differential output leads 208a and 208b, can function at a number of frequency ranges and between other signal lines that require impedance mismatch balancing. Thus, the specific inductive value of the inductor 210 will change and should be selected for the specific structural, circuit, and frequency application.

As described herein, reference was made to an integrated circuit (IC) chip, which implements wire bond leads around the IC chip's periphery. However, it should be understood that the embodiments of the present invention are equally applicable to alternative chip interconnections. For instance, it is envisioned that instead of wire bond leads, the interconnection can be achieved through flip-chip connections. Such flip-chip connections are sometimes referred to as "bumped" or "c4" conductive connections. Further, flip-chip connections are not limited to placement around the periphery of the IC chip, as the interconnections can be distributed throughout a surface of the IC chip.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A method for maintaining signal integrity of a differential output signal provided on a first differential output lead and a second differential output lead, and generated from a differential driver, said first and second differential output leads transmitting complementary signals that comprise said differential output signal, the method comprising:
   receiving the differential output signal from the differential driver; and
   tuning the differential output signal by exposing the differential output signal to a single-ended inductance having a first coupling node coupled to said first differential output lead and an opposing second coupling node coupled to said second differential output lead, the inductance being configured to reduce signal mismatch between complementary signals of the differential output signal, the signal mismatch being a result of having the complementary signals exposed to different capacitive loading.

2. A method for maintaining signal integrity of a differential output signal generated from a differential driver as recited in claim 1, wherein
   signal mismatch is defined as a time difference between when a first of said complementary signals finishes a logic transition to a first logic level and a second of said complementary signals finishes a logic transition to a second logic level, said second logic level being the logic complement of said first logic level; and
   tuning the differential output signal includes selecting an inductance so as to reduce the signal mismatch.

3. A method for maintaining signal integrity of a differential output signal generated from a differential driver as recited in claim 2, wherein:
   said differential output signal is output at a predefined frequency; and
   selecting the inductance to produce a bandpass filter to pass said predefined frequency of the differential output signal and substantially block frequencies below and above said predefined frequency.

4. The method for maintaining signal integrity of a differential output signal generated from a differential driver as recited in claim 3, wherein the differential output signal operating at a frequency of about 1.25 GHz sets the inductance to be between about 10 nH and about 25 nH.

5. A method for maintaining signal integrity of a differential output signal generated from a differential driver as recited in claim 1, further comprising:
   determining the capacitive loading of the differential signal; and
   initiating the tuning by selecting the inductance so as to reduce the signal mismatch.

6. A method for maintaining signal integrity of a differential output signal generated from a differential driver as recited in claim 1, wherein the capacitive loading has a component of parasitic capacitance affecting the differential output signal.

7. A method for maintaining signal integrity of a differential output signal generated from a differential driver as recited in claim 1, wherein the capacitive loading has a component of electrostatic discharge (ESD) capacitance affecting the differential output signal.

8. A tuning circuit for improving rise-time of a differential output signal, comprising:
   a differential driver receiving a differential input and generating a differential output signal onto a first differential output lead and a second differential output lead;
   a single-ended inductor having a first end node and a second end node, said inductor being coupled across the first differential output lead and the second differential output lead of the differential driver; and
   first electrostatic discharge (ESD) capacitive circuitry coupled to a first output terminal, the first output terminal coupled to said first end node of the inductor, and second ESD capacitive circuitry coupled to a second output terminal, the second output terminal coupled to said second end node of the inductor, the inductor being positioned between the differential driver and the first output terminal and the second output terminal,
   wherein the inductor produces an inductance between the first differential output lead and the second differential output lead, the inductance acting to reduce signal mismatch in complementary signals of the differential output signal that is to be presented to the first and second output terminals.

9. A tuning circuit for improving rise-time of a differential output signal as recited in claim 8, wherein the inductor is fabricated into one or more layers of a semiconductor substrate.

10. A tuning circuit for improving rise-time of a differential output signal as recited in claim 9, wherein the inductor is fabricated in a spiral configuration.

11. A tuning circuit for improving rise-time of a differential output signal as recited in claim 8, wherein the capacitive loading further includes parasitic capacitance of the first and second differential output leads.

12. A tuning device for improving rise-time of a differential output signal generated in a semiconductor chip, comprising:
   core circuitry;
   a differential driver, the differential driver interfacing with the core circuitry and capable of receiving a differential input from the core circuitry, the differential driver being configured to produce a differential output signal onto a first differential output lead and a second differential output lead;
   a single-ended inductor coupled across the first differential output lead and the second differential output lead of the differential driver; and
   first electrostatic discharge (ESD) circuitry coupled to the first differential output lead that connects to a first pad and the inductor, second ESD circuitry coupled to the second differential output lead that connects to a second pad and the inductor, wherein the inductor is capable of producing an inductance between the first differential output lead and the second differential output lead, the inductance acting to reduce signal mismatch in complementary signals of the differential output signal that is to be presented to the first pad and the second pad.

13. A tuning device for improving a rise-time of a differential output signal in a semiconductor chip as recited in claim 12, wherein the inductor is a multi-level structure defined on the semiconductor chip.

14. A tuning device for improving a rise-time of a differential output signal in a semiconductor chip as recited in claim 13, wherein the multi-level structure has a spiral configuration.

15. A tuning device for improving a rise-time of a differential output signal in a semiconductor chip as recited in claim 12, wherein the inductor is defined proximate to a periphery of the semiconductor chip.

16. A tuning device for improving a rise time of a differential output signal in a semiconductor chip as recited in claim 12, wherein each of the first and second pad is an input and output pad.

17. A tuning system for improving rise-time of a differential output signal generated in a semiconductor chip, comprising:
   core circuitry;
   a differential driver, the differential driver interfacing with the core circuitry and capable of receiving a differential input from the core circuitry, the differential driver being configured to produce a differential output signal onto a first differential output lead and a second differential output lead;
   first electrostatic discharge (ESD) circuitry coupled to the first differential output lead that connects to a first pad, a second ESD circuitry coupled to the second differential output lead that connects to a second pad; and
   an off-chip single-ended inductor having a first end point and an opposing second end point, the first end point of the off-chip inductor being connected to the first pad and the second end point of the off-chip inductor being connected to the second pad, the off-chip inductor producing an inductance between the first pad and the second pad, the inductance acting to reduce signal mismatch in complementary signals of the differential output signal that is to be presented to the first pad and the second pad.

18. An integrated circuit, the integrated circuit being capable of outputting a differential output signal, comprising:
   a differential driver receiving a differential input and generating a differential output signal onto a first differential output lead and a second differential output lead;
   a single-ended inductor coupled across the first differential output lead and the second differential output lead of the differential driver; and
   first electrostatic discharge (ESD) capacitive circuitry coupled to a first output terminal, the first output terminal coupled to a first coupling end of the inductor, and second ESD capacitive circuitry coupled to a second output terminal, the second output terminal coupled to a second coupling end of the inductor, the inductor being positioned between the differential driver and the first output terminal and the second output terminal;

wherein the inductor produces an inductance between the first differential output lead and the second differential output lead, the inductance acting to reduce signal mismatch in complementary signals of the differential output signal that is to be presented to the first and second output terminals.

19. An integrated circuit, the integrated circuit being capable of outputting a differential output signal as recited in claim 18, wherein signal mismatch in complementary signals of the differential output signal is eliminated when a logic high transition point of one of the complementary signals is lined up with a logic low transition point of the other of the complementary signals.

20. A system for maintaining signal integrity of a differential output signal generated by a differential driver, the system comprising:

means for receiving the differential output signal from the differential driver; and means for tuning the differential output signal by exposing the differential output signal to an inductance to shunt together both complementary signals of the differential output signal, the inductance being configured to reduce signal mismatch between complementary signals of the differential output signal, the signal mismatch being a result of having the complementary signals exposed to different capacitive loading.

21. A system for maintaining signal integrity of a differential output signal generated by a differential driver as recited in claim 20, wherein signal mismatch in complementary signals of the differential output signal is eliminated when a logic high transition point of one of the complementary signals is lined up with a logic low transition point of the other of the complementary signals.

22. An output driving circuit network, comprising:

a signal buffer having an output node, and configured to operate at a target frequency;

an output parasitic capacitance coupled to said output node;

a shunting inductance coupled to said output node, said inductance and output parasitic capacitance constituting a frequency filter, wherein said inductance is configured so that the resonant frequency of said frequency filter is substantially tuned to said target frequency;

wherein said filter is a bandpass filter tuned to said target frequency.

23. The output driving circuit network of claim 22, further having an electrostatic discharge protection circuit coupled to said output node, said output parasitic capacitance being the intrinsic parasitic capacitance of said electrostatic discharge protection circuit.

* * * * *